United States Patent [19]

Wassink

[11] 4,377,004

[45] Mar. 15, 1983

[54] SETTING CIRCUIT

[75] Inventor: Derk J. C. Wassink, Eindhoven, Netherlands

[73] Assignee: U.S. Philips Corporation, New York, N.Y.

[21] Appl. No.: 176,881

[22] Filed: Aug. 11, 1980

[30] Foreign Application Priority Data

Aug. 16, 1979 [NL] Netherlands ......................... 7906237

[51] Int. Cl.³ .......................... H04B 1/26; G04C 9/00
[52] U.S. Cl. .................................... 455/176; 324/162;
364/566; 368/187; 455/180; 377/19
[58] Field of Search ................... 455/76, 77, 165, 170,
455/176, 180, 183, 179, 185, 186; 364/565, 566;
324/160, 162, 166; 235/92 DM, 92 FQ, 92 MP;
368/69, 70, 185, 187, 188

[56] References Cited

U.S. PATENT DOCUMENTS

| | | | |
|---|---|---|---|
| 3,763,420 | 10/1973 | Maisonville | 324/166 |
| 4,267,601 | 5/1981 | Umeda et al. | 455/183 |
| 4,270,117 | 5/1981 | Ziegelbein et al. | 455/185 |
| 4,281,415 | 7/1981 | Rock, Jr. | 455/179 |
| 4,306,302 | 12/1981 | Sekiya et al. | 368/187 |

Primary Examiner—Marc E. Bookbinder
Attorney, Agent, or Firm—Thomas A. Briody; William J. Streeter; Laurence A. Wright

[57] ABSTRACT

To render a setting circuit more suited to the use of a microprocessor, the frequency of pulses applied by a setting shaft are periodically measured and the value found is multiplied by a weighting factor which depends on the speed of rotation of the setting shaft. The weighted, measured values are integrated and the integrated value can be used to tune a receiver or to set the time display of a clock.

4 Claims, 2 Drawing Figures

SETTING CIRCUIT

The invention relates to a setting circuit having circuit portions which operate simultaneously, or consecutively or are assemblable or can be made operative by a processor, it being possible to obtain with this setting circuit a digital signal combination which represents a value which depends on the rotation of a setting shaft to which a pulse generator is coupled which, on rotation of the shaft, applies pulses to a speed of rotation measuring circuit, which, when the speed of rotation is increased or reduced, causes an accelerated or delayed change in the value represented by the digital signal combination, the setting circuit comprising a counting circuit coupled to the pulse generator for counting the pulses supplied by the pulse generator.

BACKGROUND OF THE INVENTION

The German Auslegeschrift No. 2726383 discloses such a setting circuit wherein on rotation of the setting shaft the counting circuit is supplied with pulses which ensure that the counting circuit supplies a digital signal combination which depends on the rotation of the setting shaft. In order to obtain an accelerated change in the digital signal combination when the speed of rotation of the setting shaft is increased, the number of pulses per angle of rotation of the setting shaft applied to the counting circuit is increased. This may be done by switching the counting input of the counting circuit from an output of the pulse generator to an output of a source of high frequency pulses, or by multiplying the frequency of the pulses supplied by the pulse generator coupled to the setting shaft, these pulses being applied to the counting input. These methods are not attractive when a microprocessor is used.

OBJECT OF THE INVENTION

The invention has for its object to provide a setting circuit which is more suited to the use of a microprocessor.

SUMMARY OF THE INVENTION

According to the invention, a setting circuit of the type described in the opening paragraph is therefore characterized in that the counting circuit (13) comprises a periodical resetting circuit (21) whereas the setting circuit comprises an integrating circuit (37) in which periodically occurring final positions of the counting circuit (13) are combined in order to obtain the digital signal combination, with a multiplying factor which is adjustable by means of a speed of rotation measuring circuit (101).

The invention is based on the recognition of the fact that it is easier to multiply a number than a signal frequency. Therefore, this frequency, that is to say the speed of rotation of the setting shaft, is converted into a number by a periodically occurring frequency measurement and this number is multiplied by desired factor. Accelerating and delaying the change in the digital signal combination is now done by increasing or reducing the multiplying factor by which a number which depends on the speed of rotation of the setting shaft and is received from the counting circuit is multiplied, this being an operation which can be easily performed by a microprocessor.

A setting circuit according to the invention is, for example, suitable for use as the tuning circuit of a wireless receiver or as a circuit for setting a digital clock by another clock or for both these purposes in a radio incorporating a clock.

BRIEF DESCRIPTION OF THE DRAWINGS

The invention will now be further explained by way of non-limitative examples with reference to the accompanying drawing wherein.

DETAILED DESCRIPTION OF THE PREFERRED EMBODIMENTS

Figure 1:
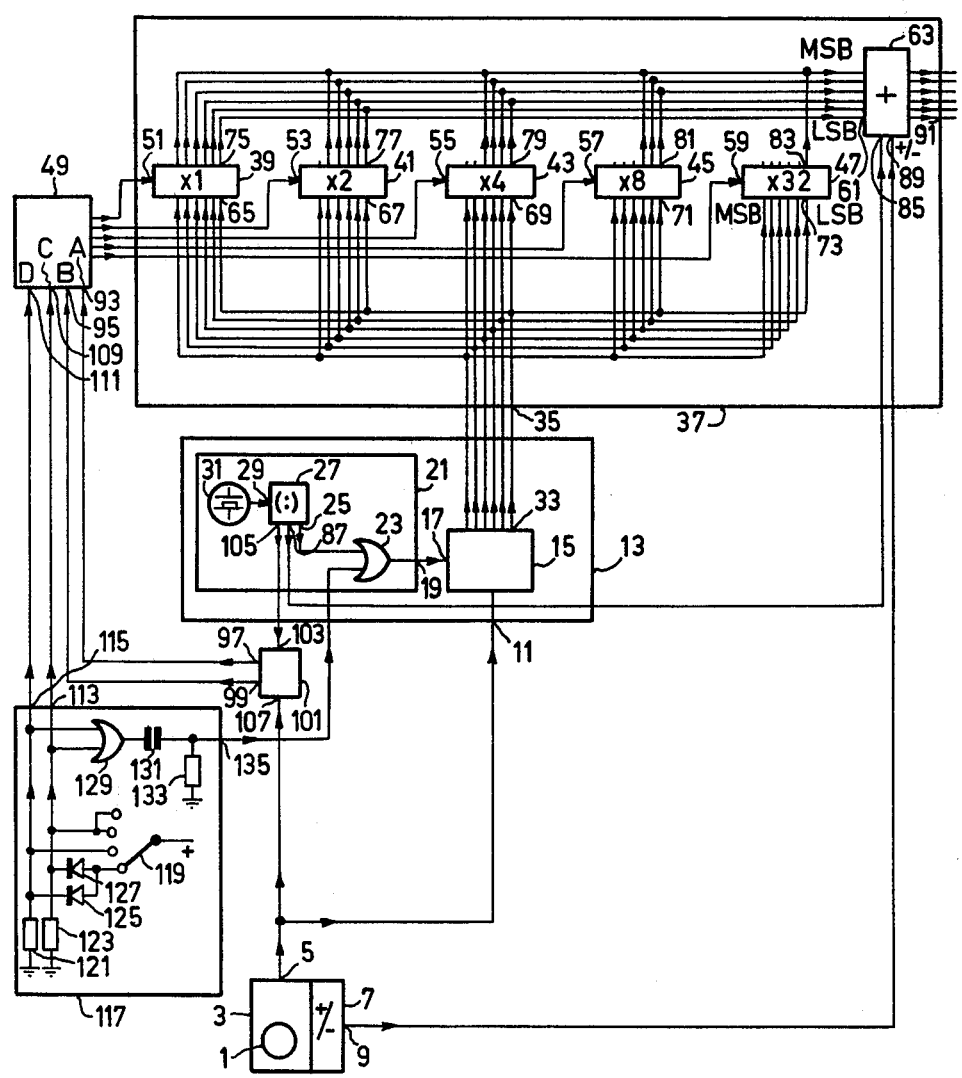
FIG. 1 illustrates a setting circuit according to the invention by means of a block schematic circuit diagram.

Referring to FIG. 1, a setting shaft 1 is coupled to a pulse generator 3, which supplies at an output 5 a predetermined number of pulses for a predetermined angular rotation of the setting shaft 1. A direction of rotation detector 7 which, at its output 9, supplies a signal the value of which corresponds with the direction of rotation of the setting shaft is coupled to the pulse generator 3. Setting shaft, pulse generator and direction of rotation detector combinations are known per se and require no further explanation.

A pulse signal occurring at the input 5 of the pulse generator 3 when the setting shaft 1 is rotated is applied to an input 11 of a counting circuit 13. This input 11 is also the counting signal input of a counter 15, which has a resetting input 17, which is connected to an output 19 of a periodical resetting circuit 21. This output 19 is also the output of an OR-gate 23, an input of which is connected to an output 25 of a frequency divider 27, an input 29 of which receives a signal coming from a crystal oscillator 31 and having a frequency of, for example, 4 MHz, which signal is converted by the frequency divider 27 into a signal of, for example 5 Hz, causing the counter 15 to be reset to zero five times per second so that it reaches five times per second a final value which depends on the angular rotation of the setting shaft 1 in the preceding period of time. A signal combination which represents the counter position is applied to a group of inputs 35 of an integrating circuit 37. This signal combination is obtained from a group of outputs 33 of the counter 15. For the sake of clarity, only the six most significant outputs, whose significance decreases from the left to the right, are shown in the group of outputs 33 and in the connections in the integrating circuit. A fourteen-bit counter 15 is preferred for use in tuning circuits.

The integrating circuit 37 comprises five transfer circuits 39, 41, 43, 45, 47, one of which passes, in response to a signal applied by a multiplying factor selection circuit 49 to an input 51, 53, 55, 57 or 59 of the transfer circuits, its input signal combination to a group of inputs 61 of a combining circuit 63. This input signal combination at the transfer circuits 39, 41, 43, 45, 47 is obtained from the group of inputs 35 of the integrating circuit 37, the inputs of which are through-connected to corresponding inputs of groups of inputs 65, 67, 69, 71, 73 of the transfer circuits 39, 41, 43, 45, 47.

The transfer circuit 39 has a group of outputs which correspond to its inputs 65. The least significant one of these outputs, so the extreme right-hand output 75, is connected to the least significant input of the group of inputs 61 of the combining circuit 63. The other inputs of the transfer circuit 39, their significance increasing from the right to the left, are connected to corresponding inputs of the combining circuit 63, whose significance increases from bottom to top. The least significant group of outputs 77 of the transfer circuit 41 which correspond to the group of inputs 67 is connected to the least significant input but one of the group 61 of the combining circuit 63, the least significant output but one to the least significant input but two etc. The most significant output of the group 67 is not through-connected. Of the transfer circuit 43, the least significant output of the group of outputs 69 which correspond to the group 69 of inputs is connected to the least significant input but two of the group 61 of the combining circuit 63, the least significant output but two to the least significant input but three etc. The two most significant outputs are not through-connected. The least significant input of a group of inputs 81, which correspond to the group of inputs 71, of the transfer circuit 45, is connected to the least significant input but three of the group 61 of the combining circuit 63, the least significant output but one to the least significant input but four etc. The three most significant outputs are not through-connected. The least significant output of a group of outputs 83, which correspond to the group of inputs 73, of the transfer circuit 47 is connected to the least significant input but five of the group 61 of the combining circuit 63. The remaining outputs are not through-connected.

As a result of this manner of through-connecting, the outputs of the transfer circuits 39, 41, 43, 45, 47 to the inputs of the combining circuit 63, the value obtained from the counter 15 is transferred via the transfer circuits 39 and 41, 43, 45, 47, respectively, multiplied by a factor of one and two, four, eight, thirty-two, respectively, to the combining circuit 63, depending on which transfer circuit is operative. In the combining circuit this multiplied value is combined under the control of a periodically occurring five Hz signal which is applied to an input 85 of this combining circuit and obtained from an output 87 of the divider 27, is added to an already available value with a sign which depends on a signal occurring at an input 89, which is connected to the output 9 of the direction of rotation detector 7.

Now, the combining circuit 63 applies to a group of inputs 91 of the integrating circuit a digital signal combination which here serves as a tuning datum and which changes more rapidly when the position of the setting shaft is changed according as a higher multiplying factor has been switched on. This multiplying factor depends on which of the transfer circuits 39, 41, 43, 45, 47 is operative. This is determined by a signal present at one of the inputs 51, 53, 55, 57 or 59 and received from the multiplying factor selection circuit 49.

This multiplying factor selection circuit 49 is a gate circuit which receives at two inputs 93, 95 a signal combination coming from two outputs 97, 99 of a circuit 101 for measuring the speed of rotation of the setting shaft 1. An input 103 of this circuit 101 receives a signal coming from an output 105 of the divider 27 and an input 107 receives a signal coming from the output 5 of the pulse generator 3. Consequently, the signal combination at the inputs 93, 95 of the multiplying factor selection circuit 49 depends on the speed of rotation of the setting shaft 1. Furthermore, a signal combination received from two outputs 113, 115 of a wave range selection circuit 117 is applied to two inputs 109, 111 of the multiplying selection circuit 49.

The wave range selection circuit 117 comprises a switch 119 which is coupled to a wave range change-over switch of a receiver in which the setting circuit is incorporated. By way of two diodes 125, 127, the other ends of which are connected to ground via resistors 121, 123, may provide a positive voltage at the two outputs 113, 115 or a positive voltage at one of those outputs. Let it be assumed that the position shown in the drawing corresponds with the long wave (L) and the other positions with the medium wave (M), the short (K) and the F.M. band (FM), respectively.

Via an OR-gate 129 and a differentiating network 131, 133, the wave range switch supplies at each change to a different position, a pulse at an output 135, which is connected to a further input of the OR-gate 23. This causes the counter 15 to be reset to its zero position at each change-over to a different wave range. The following truth table may hold for the gate circuit 129, the speed of rotation of the setting shaft being denoted by S for slow, I for moderate and Q for rapid.

| Position of switch 119 | Speed of rotation of setting shaft 1 | Input | | | | Input | | | | |
|---|---|---|---|---|---|---|---|---|---|---|
| | | 93 | 95 | 109 | 111 | 51 | 53 | 55 | 57 | 59 |
| L | S | 0 | 0 | 1 | 1 | 1 | 0 | 0 | 0 | 0 |
| L | I | 1 | 0 | 1 | 1 | 1 | 0 | 0 | 0 | 0 |
| L | Q | 0 | 1 | 1 | 1 | 0 | 0 | 1 | 0 | 0 |
| M | S | 0 | 0 | 0 | 1 | 1 | 0 | 0 | 0 | 0 |
| M | I | 1 | 0 | 0 | 1 | 0 | 0 | 0 | 1 | 0 |
| M | Q | 0 | 1 | 0 | 1 | 0 | 0 | 0 | 0 | 1 |
| K & FM | S | 0 | 0 | 1 | 0 | 1 | 0 | 0 | 0 | 0 |
| K & FM | I | 1 | 0 | 1 | 0 | 0 | 1 | 0 | 0 | 0 |
| K & FM | Q | 0 | 1 | 1 | 0 | 0 | 0 | 0 | 1 | 0 |
| | | A | B | C | D | V | W | X | Y | Z |

When the signal at the inputs 51, 53, 55, 57, 59 of the transfer circuits 39, 41, 43, 45, 47 denoted by V, W, X, Y, Z, respectively, and the signal at the inputs 93, 95, 109, 111 are denoted A, B, C, D, respectively, then Boolean algebra produces:

V = A'B'CD + AB'CD + A'B'C'D + A'B'C
D' = B'D(A' + C) + A'B'CD'
W = AB'CD'
X = A'BCD
Y = AB'C'D + A'BCD'
Z = A'BC'D in which an accent notation denotes an inversion.

The tuning datum at the group of outputs 91 of the integrating circuit 37 then changes with increments which, compared with a slow tuning action, are thirty-two times larger in a rapid tuning action in the medium wave band and eight times larger for a moderately rapid tuning action. In the long wave range, the change in the tuning datum is four times as large for a rapid tuning than for a slow tuning action and for a moderately rapid tuning the change is of the same step size as with a slow tuning. For the short wave and the F.M. band the tuning datum changes with increments which, for a rapid tuning action is eight times as large as in a slow tuning action and twice as large for a moderately rapid tuning action. It will be clear that this tuning pattern can be adapted in a simple manner to other wishes.

Further, it will be clear that the signal combination at the group of outputs may, for example, also be used for setting a clock. Then, only the signals A and B at the outputs 97, 99 of the frequency measuring circuit 101 are used and the number of transfer circuits may then be adapted to this situation.

When the signal combination is used for setting a clock and also when a tuning datum is used in, for example, a clock radio the change-over must, of course, be adapted.

In a microprocessor the multiplying function of the combination of transfer circuits can be effected in a simple manner by a shifting operation.

Figure 2:
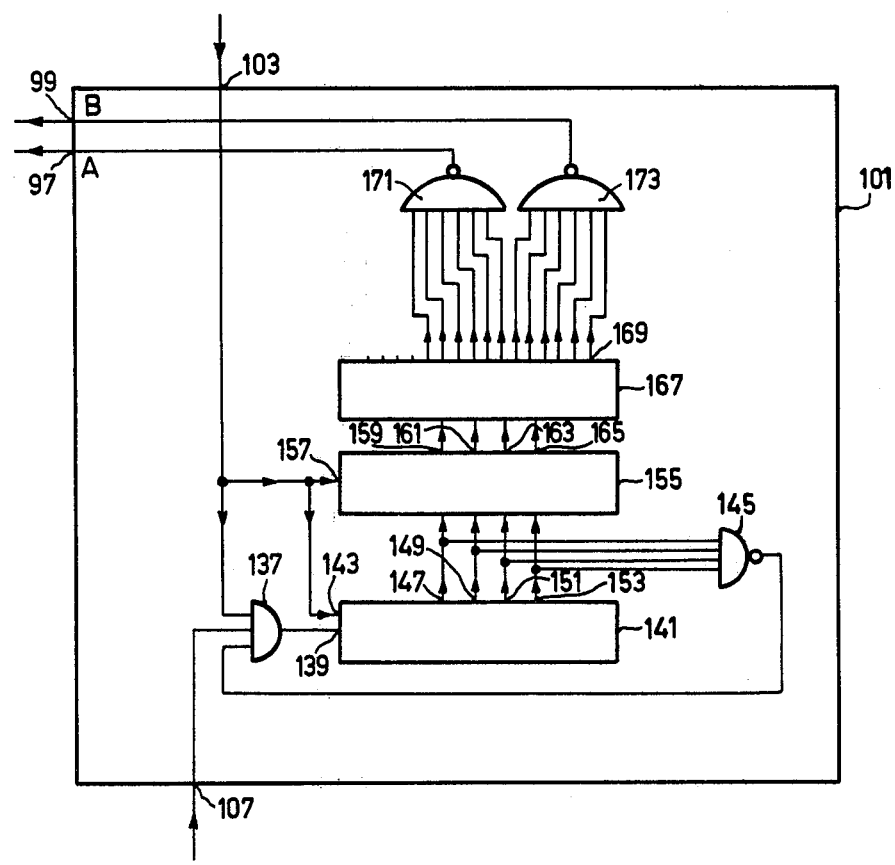
FIG. 2 illustrates a circuit for measuring the speed of rotation of the setting shaft of the setting circuit shown in FIG. 1.

Referring to FIG. 2, corresponding components have been given the same reference numerals as in FIG. 1. The signal which is produced by the pulse generator 3 and whose frequency must be measured is applied to the input 107. By way of an AND-gate 137, this signal reaches a counting input 139 of a counter 141. A second input of the AND-gate 137 is connected to the input 103, to which the signal which is used as time standard and was received from the frequency divider 27, is applied. This signal opens the AND-gate 137 each time for a very definite period of time, a number of pulses coming from the input 107 being allowed to pass the input 139 of the counter 141 during this period of time. For each measuring time period the counter 141 is reset to zero as the signal at the input 103 is also applied to a reset signal input 143 of the counter 141. A third input of the AND-gate 137 is connected to an output of a NAND-gate 145 the inputs of which are connected to outputs 147, 149, 151, 153 of the counter 141. As long as the counter 141 has not cycled through its entire range, the third input of the AND-gate 137 is high and may be supplied during the measuring time periods with the pulses to be counted.

The outputs 147, 149, 151, 153 of the counter 141 are connected to corresponding inputs of a store 155 in which, in response to a signal applied to an input 157 thereof, this signal coming from the input 103, the final position attained by the counter 141 is stored at the end of each measuring time period. This final position is transferred to inputs of a code converter 167 via outputs 159, 161, 163, 165. This code converter converts the stored counter position which appears in a binary code at the outputs 159, 161, 163, 165, into a signal combination of one logic zero and fifteen logic ones at a group of sixteen outputs 169 of the code converter 167. The relevant logic zero is shifted from the left to the right in this group according as the value of the signal combination supplied by the counter becomes higher. The four extreme left-hand outputs of the sixteen outputs of the group 169 are not used. The next six outputs are connected to inputs of a NAND-gate 171 and the last six inputs are connected to inputs of a NAND-gate 173. The output of the NAND-gate 171 is connected to the output 97 and the output of the NAND-gate 173 is connected to the output 99 of the circuit for measuring the speed of rotation 101.

When the speed of rotation of the setting shaft 1 is low, the position of the counter 141 in the measuring time period remains low and the logic zero appears at one of the four unconnected outputs of the code converter 167. The outputs 97 and 99 then remain logic zero. At a moderate speed of rotation of the setting shaft the counter position in the measuring time intervals becomes such, that the logic zero appears at one of the inputs of the NAND-gate 171, causing the output 97 to become logic one. At a rapid rotation of the setting shaft one of the inputs of the NAND-gate becomes logic zero and the output 99 becomes logic one. At a very high speed of rotation of the setting shaft 1 the counter 141 reaches its final value before the end of a measuring time period, causing all inputs of the NAND-gate 145 to become logic one and its output logic zero, as a result of which the AND-gate 137 is rendered non-conductive and the counter position cannot increase any further so that then also the output 99 becomes logic one.

What is claimed is:

1. A setting circuit capable of obtaining a digital signal combination which represents a value that depends on the rotation of a setting shaft comprising:
    a rotatable setting shaft,
    a pulse generator coupled to said setting shaft,
    means for measuring the speed of rotation of said shaft, said measuring means receiving pulses from said pulse generator upon the rotation of said shaft which when the speed of rotation of said shaft is increased or decreased causes an accelerated or decelerated change in the value represented by said digital combination,
    a counting circuit which is coupled to said pulse generator for counting the pulses applied to said rotation measuring means, said counting circuit comprising a periodic resetting circuit,
    means for establishing a multiplying factor, and
    a combining circuit in which periodically occurring final pulse count states of said counting circuit are combined in order to obtain said digital combination with a multiplying factor from said multiplying means which is adjustable by said rotation measuring means.

2. A setting circuit as claimed in claim 1 which forms part of a receiver tuning circuit comprising:
    a wave range selector circuit, and
    a circuit coupled to said multiplying means for changing the multiplying factor under the influence of said wave range selection circuit.

3. A setting circuit as claimed in claim 2, wherein said resetting circuit is coupled to said wave range selection circuit for resetting said counter when the wave range is changed.

4. A setting circuit capable of obtaining a digital combination signal which represents a value that depends upon the rotation of a setting shaft conprising:
    a setting shaft,
    means coupled to said shaft for generating a series of pulses related to the setting of said shaft,
    means coupled to said pulse generating means for counting said pulses,
    means coupled to said counting means for periodically obtaining said digital combination signals,
    means coupled to said pulse generating means for measuring the speed of rotation of said shaft, said measuring means receiving pulses from said pulse generating means upon the rotation of said shaft such that when the speed of rotation of said shaft is varied it causes a variable change in the value represented by said digital combination signals,
    means coupled to said pulse generating means for counting the pulses applied to said means for measuring the speed of rotation of said shaft,
    means for resetting said counting means causing said counting means to be reset to zero five times per second so that it reaches a final value which depends upon the angular rotation of said shaft,
    means coupled to said pulse generating means for determining the direction of rotation of said shaft,
    means for switching over to long wave, medium wave, and short-wave signals,
    means for establishing a multiplying factor, and
    means responsive to said wave switching means for changing the multiplying factor.

* * * * *